(12) United States Patent
Shih

(10) Patent No.: US 9,922,845 B1
(45) Date of Patent: Mar. 20, 2018

(54) SEMICONDUCTOR PACKAGE AND FABRICATION METHOD THEREOF

(71) Applicant: Micron Technology, Inc., Boise, ID (US)

(72) Inventor: Shing-Yih Shih, New Taipei (TW)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/342,124

(22) Filed: Nov. 3, 2016

(51) Int. Cl.
*H01L 21/00* (2006.01)
*H01L 21/48* (2006.01)
*H01L 23/498* (2006.01)
*H01L 23/522* (2006.01)
*H01L 25/065* (2006.01)
(Continued)

(52) U.S. Cl.
CPC ........ *H01L 21/4853* (2013.01); *H01L 21/486* (2013.01); *H01L 21/4857* (2013.01); *H01L 21/565* (2013.01); *H01L 23/3128* (2013.01); *H01L 23/49816* (2013.01); *H01L 23/49827* (2013.01); *H01L 23/49866* (2013.01); *H01L 23/5226* (2013.01); *H01L 23/5283* (2013.01); *H01L 23/53223* (2013.01); *H01L 23/53238* (2013.01); *H01L 23/53252* (2013.01); *H01L 23/53266* (2013.01); *H01L 25/0652* (2013.01); *H01L 25/50* (2013.01)

(58) Field of Classification Search
None
See application file for complete search history.

(56) References Cited

U.S. PATENT DOCUMENTS 9,449,935 B1 * 9/2016 Shih ................. H01L 24/17
2010/0263923 A1 * 10/2010 Kodani ............ H01L 21/4853
174/260

(Continued)

FOREIGN PATENT DOCUMENTS

TW 201108367 A 3/2011
TW 201322388 A 6/2013
(Continued)

OTHER PUBLICATIONS

Taiwanese Office Action, dated Jun. 30, 2017, and Search Report, dated May 27, 2017, for Taiwanese Application No. 106104555, 16 pages.

(Continued)

*Primary Examiner* — Angel Roman
(74) *Attorney, Agent, or Firm* — TraskBritt

(57) ABSTRACT

A method for fabricating a semiconductor package is disclosed. A substrate is provided and a first passivation layer is formed on the substrate. Trenches are formed partially through the substrate. Metal via structures are formed in the trenches. An RDL structure is formed on the first passivation layer. A second passivation layer is formed on the RDL structure. Openings are formed in the second passivation layer to expose bump pads. First metal pillars are formed on the bump pads. Semiconductor dies are mounted onto the metal pillars. A molding compound is formed to cover the semiconductor dies. The substrate is removed, thereby exposing the first passivation layer and protrudent portions (second metal pillars) of the metal via structures. C4 bumps are formed directly on the second metal pillars, respectively.

18 Claims, 20 Drawing Sheets

(51) Int. Cl.
  *H01L 25/00* (2006.01)
  *H01L 23/528* (2006.01)
  *H01L 23/532* (2006.01)
  *H01L 21/56* (2006.01)
  *H01L 23/31* (2006.01)

(56) References Cited

U.S. PATENT DOCUMENTS

| | | | | |
|---|---|---|---|---|
| 2011/0193221 | A1* | 8/2011 | Hu | H01L 21/563 257/737 |
| 2012/0056315 | A1* | 3/2012 | Chang | H01L 21/6835 257/737 |
| 2012/0181708 | A1* | 7/2012 | Furutani | H01L 23/3128 257/787 |
| 2014/0273350 | A1* | 9/2014 | Kwak | H01L 25/50 438/109 |
| 2015/0137384 | A1* | 5/2015 | Huemoeller | H01L 23/49816 257/774 |
| 2015/0262902 | A1* | 9/2015 | Shen | H01L 23/315 438/107 |

FOREIGN PATENT DOCUMENTS

| | | |
|---|---|---|
| TW | 201413887 A | 4/2014 |
| TW | 201417235 A | 5/2014 |
| TW | 201428919 A | 7/2014 |
| TW | 201448068 A | 12/2014 |
| TW | 201618256 A | 5/2016 |

OTHER PUBLICATIONS

Taiwanese Office Action, dated Nov. 20, 2017, and Search Report, dated Oct. 15, 2017, for Taiwanese Application No. 106104555, 6 pages.

* cited by examiner

SEMICONDUCTOR PACKAGE AND FABRICATION METHOD THEREOF

TECHNICAL FIELD

The present invention relates generally to the field of semiconductor packaging. More particularly, the present invention relates to a method for fabricating a semiconductor package with a thin RDL interposer structure.

BACKGROUND

Integrated circuit (IC) chips are typically assembled into packages that are soldered to a printed circuit board (PCB). Each integrated circuit chip may be connected to a substrate of the package with a number of solder bumps in a process commonly referred to as controlled collapsed chip connection (C4).

As known in the art, an interposer substrate such as a silicon interposer with through silicon vias (TSVs) is usually used in semiconductor packaging to "fan out" the contacts of the integrated circuit chips. However, TSV silicon interposers are expensive. Therefore, it is desirable to provide an improved semiconductor package having an interposer without using TSV and silicon substrate (TSV-less interposer), while the interposer is still able to provide very fine pitch interconnections.

However, the RDL interposer structure without TSV is thin and is difficult to handle during the packaging process. For example, a lithographic process is often used to define pad openings for further connection on the interposer. The warping of the thin RDL interposer structure may result in misalignment of the pad opening and hence reducing the production yield. Therefore, it is also desirable to provide a method for fabricating a semiconductor package utilizing such a thin RDL interposer structure, which is capable of overcoming the difficulty as mentioned above.

BRIEF SUMMARY

It is one object of the invention to provide a method for fabricating a semiconductor package with a thin RDL interposer structure.

According to one aspect of the invention, a method for fabricating a thin redistribution layer (RDL) interposer structure is disclosed. A substrate having opposite first and second surfaces is provided. A first passivation layer is formed on the first surface of the substrate. A plurality of trenches is formed through the first passivation layer and partially through the substrate. Metal via structures are formed in the trenches. A redistribution layer (RDL) structure is then formed on the first passivation layer. First metal pillars for further connection to semiconductor dies are then formed on the RDL structure.

According to one aspect of the invention, a method for fabricating a semiconductor package is disclosed. A substrate having opposite first and second surfaces is provided. A first passivation layer is formed on the first surface of the substrate. A plurality of trenches is formed through the first passivation layer and partially through the substrate. The plurality of trenches is filled with an under bump metallurgy (UBM) material to form metal via structures. A redistribution layer (RDL) structure is formed on the first passivation layer. A second passivation layer is formed on the RDL structure. Openings are formed in the second passivation layer to expose bump pads of the RDL structure. First metal pillars are formed on the bump pads, respectively. A die attachment process is performed to mount semiconductor dies onto the first metal pillars. A molding compound is formed to cover the semiconductor dies and the first passivation layer. A portion of the substrate is removed by grinding. The remaining portion of the substrate is removed by wet etching to expose the first passivation layer and protrudent portions of the metal via structures, thereby forming second metal pillars. Connecting elements such as solder bumps are formed directly on the second metal pillars, respectively.

According to another aspect of the invention, a method for fabricating a semiconductor package is disclosed. A substrate having opposite first and second surfaces is provided. A first passivation layer is formed on the first surface of the substrate. A plurality of trenches is formed through the first passivation layer and partially through the substrate. The trenches are filled with a conductive material to form metal via structures. A redistribution layer (RDL) structure is formed on the first passivation layer. A second passivation layer is formed on the RDL structure. Openings are formed in the second passivation layer to expose bump pads of the RDL structure. First metal pillars are formed on the bump pads, respectively. A carrier is bonded onto the RDL structure. The substrate is subjected to a substrate thinning process to remove a portion of the substrate. A wet etch back process is performed to remove remaining portion of the substrate, thereby exposing the first passivation layer and protrudent portions of the metal via structures, and forming second metal pillars. Semiconductor dies are mounted on the second metal pillars. A molding compound is formed to cover the semiconductor dies and the first passivation layer. The carrier is then removed to expose the first metal pillars and the second passivation layer. Connecting elements such as solder bumps are formed directly on the first metal pillars, respectively.

These and other objectives of the present invention will no doubt become obvious to those of ordinary skill in the art after reading the following detailed description of the preferred embodiment that is illustrated in the drawings.

BRIEF DESCRIPTION OF THE DRAWINGS

The accompanying drawings are included to provide a further understanding of the embodiments, and are incorporated in and constitute a part of this specification. The drawings illustrate some of the embodiments and, together with the description, serve to explain their principles. In the drawings.

DETAILED DESCRIPTION

Figure 1:
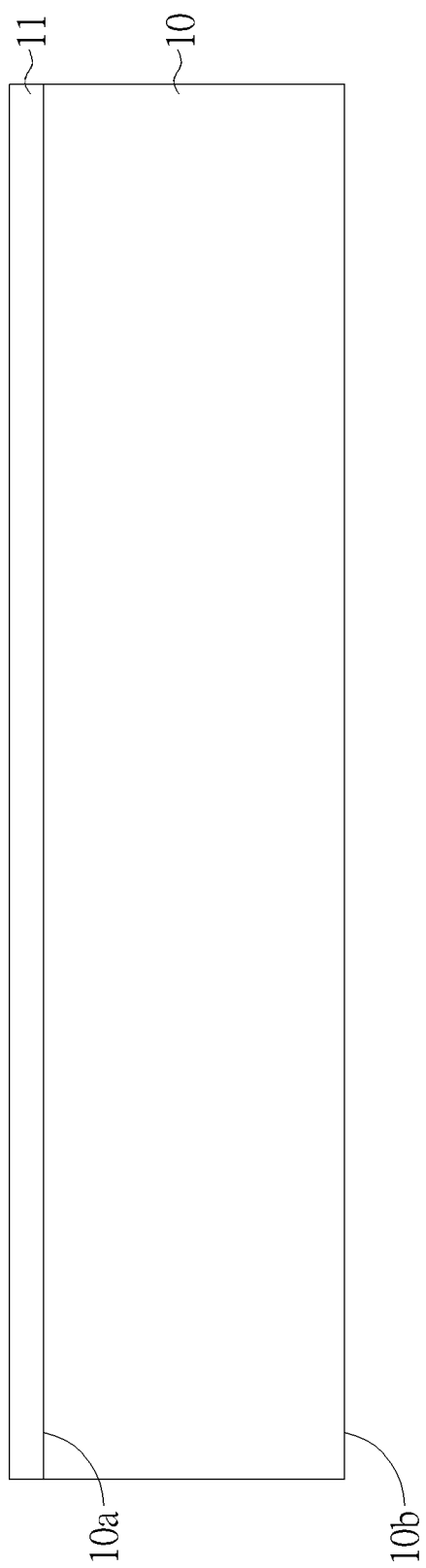
FIG. 1 to FIG. 9 are schematic, cross-sectional diagrams illustrating an exemplary method of fabricating a semiconductor package in accordance with one embodiment of the invention.

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention. Other embodiments may be utilized and structural changes may be made without departing from the scope of the present disclosure.

The following detailed description is, therefore, not to be taken in a limiting sense, and the scope of the present invention is defined only by the appended claims, along with the full scope of equivalents to which such claims are entitled.

One or more implementations of the present invention will now be described with reference to the attached drawings, wherein like reference numerals are used to refer to like elements throughout, and wherein the illustrated structures are not necessarily drawn to scale. The terms "die," "chip," "semiconductor chip," and "semiconductor die" are used interchangeably throughout the specification.

The terms "wafer" and "substrate" used herein include any structure having an exposed surface onto which a layer is deposited according to the present disclosure, for example, to form the circuit structure such as a redistribution layer (RDL). The term "substrate" is understood to include semiconductor wafers, but is not limited thereto. The term "substrate" is also used to refer to semiconductor structures during processing, and may include other layers that have been fabricated thereupon.

FIG. 1 to FIG. 9 are schematic, cross-sectional diagrams illustrating an exemplary method of fabricating a semiconductor package in accordance with one embodiment of the invention, wherein FIG. 1 to FIG. 4 illustrate an exemplary method for fabricating a thin redistribution layer (RDL) interposer structure.

As shown in FIG. 1, a substrate 10 is provided. According to the embodiment of the invention, the substrate 10 may comprise silicon or III-V semiconductors, but is not limited thereto. For example, according to one embodiment, the substrate 10 may be a wafer-shaped silicon substrate. The substrate 10 has an opposite first surface 10a and second surface 10b. A first passivation layer 11 is deposited on the first surface 10a of the substrate 10. The first passivation layer 11 may comprise a dielectric layer. For example, the first passivation layer 11 may comprise silicon nitride, silicon oxide, silicon oxy-nitride, polyimide, or any combinations thereof.

Figure 2:
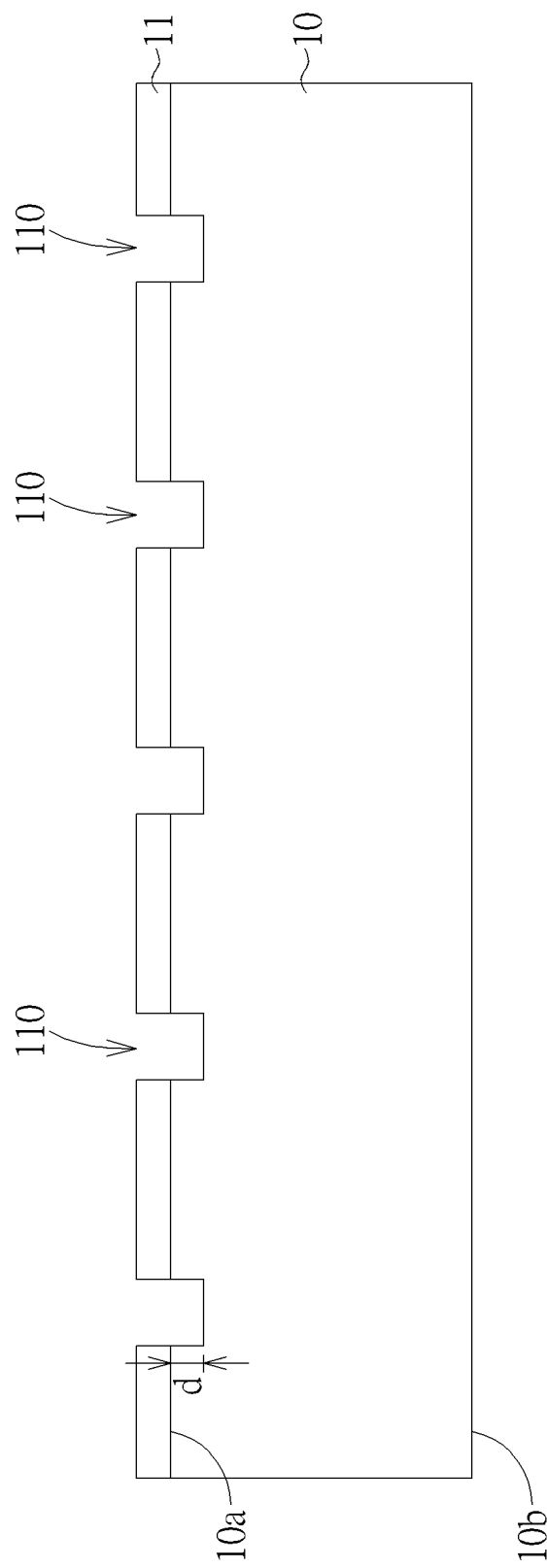

As shown in FIG. 2, a plurality of trenches 110 is formed completely through the first passivation layer 11 and extending into substrate 10 using lithography, mechanical drilling, laser drilling, reactive ion etching (RIE), or a combination thereof. The trenches 110 partially extend from the first surface 10a, but not completely through the substrate 10. For example, each of the trenches 110 may have a depth d that is not greater than 50 micrometers.

According to the embodiment, the trenches 110 may have the same diameter. According to another embodiment, the trenches 110 may have different diameters.

Figure 3:
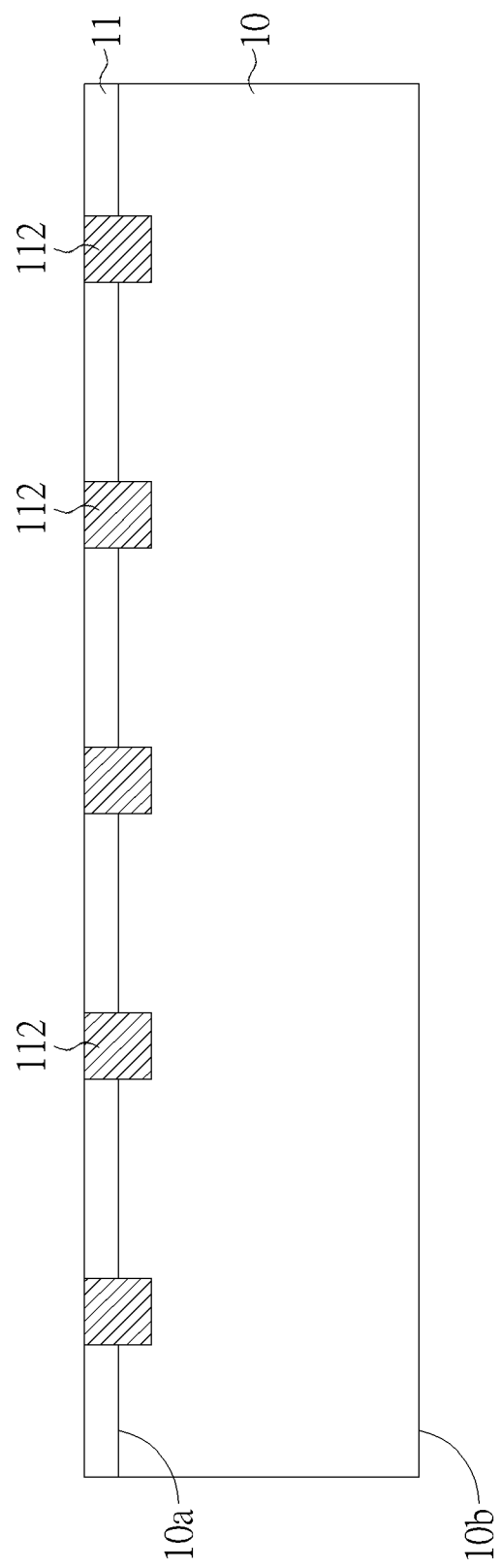

As shown in FIG. 3, subsequently, the trenches 110 are filled with a conductive material, thereby forming metal via structures 112. The conductive material may include, but is not limited to, copper, chrome, nickel, aluminum, gold, silver, tungsten, titanium, or titanium nitride. The conductive material may be formed by using electrolytic plating, electroless plating, evaporation, sputtering, printing, or other suitable metal deposition processes.

According to the embodiment, the conductive material completely fills up the trenches 110. The conductive material may have a multiple layer structure comprising, for example, an adhesive layer, a barrier metal, a seed layer, a wetting layer, or combinations thereof. According to the embodiment, no dielectric lining is formed between the substrate 10 and the conductive material that fills into the trenches 110.

It is understood that after the deposition of conductive material, the excess conductive material on the first passivation layer 11 may be removed or planarized by using chemical mechanical polishing (CMP) methods. After CMP, the top surface of the first passivation layer 11 is exposed.

Figure 4:
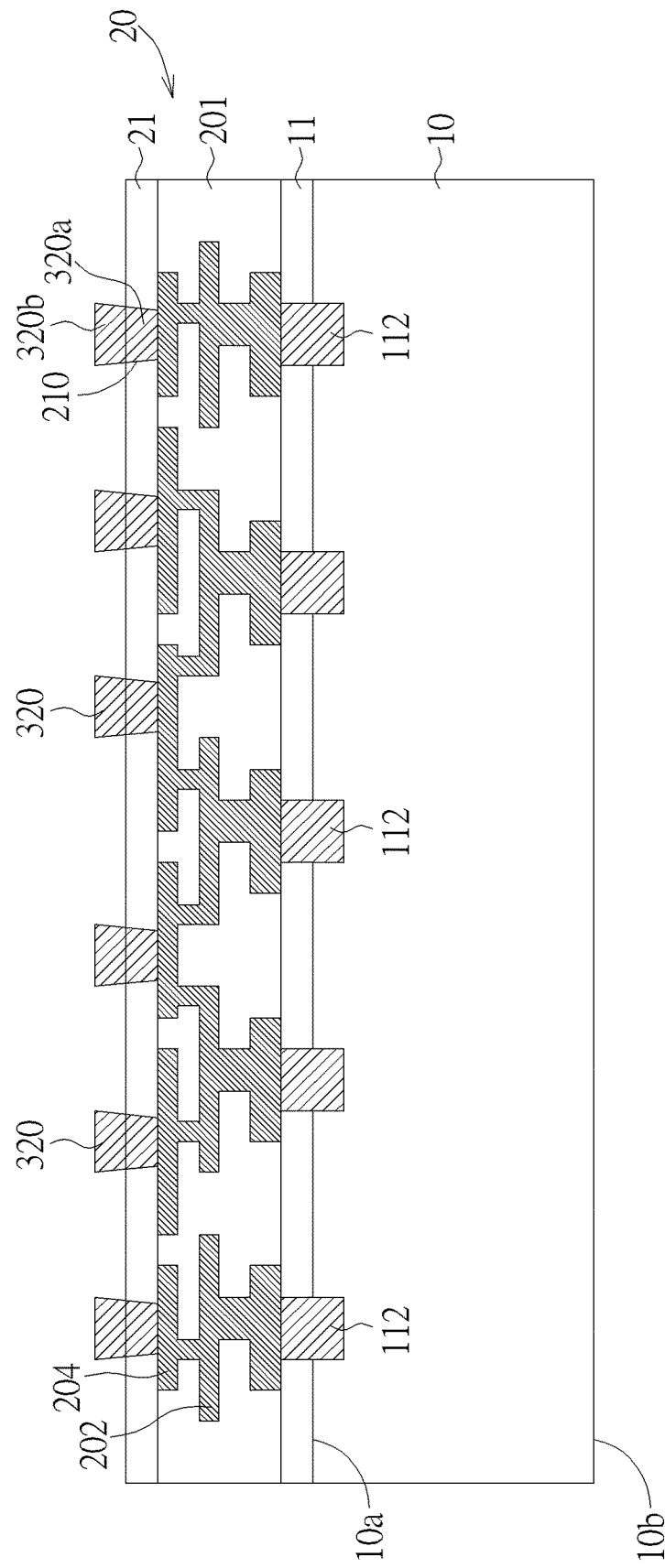

As shown in FIG. 4, subsequently, a redistribution layer (RDL) structure 20 is fabricated on the first passivation layer 11. According the embodiment of the invention, the RDL structure 20 may comprise at least one dielectric layer 201 and at least one rewiring layer 202. It is understood that the RDL structure 20 may comprise multiple layers of dielectric materials and multiple layers of rewiring layers as depicted in FIG. 4.

According to the embodiment, the dielectric layer 201 may comprise polyimide, benzocyclobutene (BCB), or the like. According to another embodiment, the dielectric layer 201 may comprise silicon oxide, silicon nitride, silicon oxy-nitride, but is not limited thereto. The rewiring layer 202 may comprise copper, aluminum, or a suitable metal alloy, but is not limited thereto. The rewiring layer 202 may have a fine-pitch damascened wiring structure, for example, a copper damascene structure.

According to the embodiment, a plurality of bump pads 204 may be formed in the RDL structure 20 and is electrically connected to the rewiring layer 202. According to the embodiment, the metal via structures 112 are electrically connected to the rewiring layer 202.

According to the embodiment, a second passivation layer 21 may be formed on the RDL structure 20. The bump pads 204 may be exposed, respectively, by pad openings 210 formed in the second passivation layer 21. According to the embodiment, the second passivation layer 21 may comprise a dielectric layer, but is not limited thereto. For example, the second passivation layer 21 may comprise silicon nitride, silicon oxide, silicon oxy-nitride, polyimide, or a combination thereof. According to another embodiment, the second passivation layer 21 may comprise a solder mask, but is not limited thereto.

A plurality of first metal pillars 320 such as micro-bumps or the like is formed on the respective bump pads 204. According to the embodiment, each of the plurality of first metal pillars 320 may comprise a UBM structure 320a and a conductive bump 320b capping the UBM structure 320a. The conductive bump 320b may comprise a solder bump or a metal bump. For example, the first metal pillars 320 may have a bump pitch that matches the input/output (I/O) pad pitch on an active surface of a semiconductor die. For example, the first metal pillars 320 may comprise copper, gold, or any suitable metals. It is understood that the first metal pillars 320 may further comprise a metal finish and a solder cap (not explicitly shown) formed on the first metal pillars 320.

Figure 5:
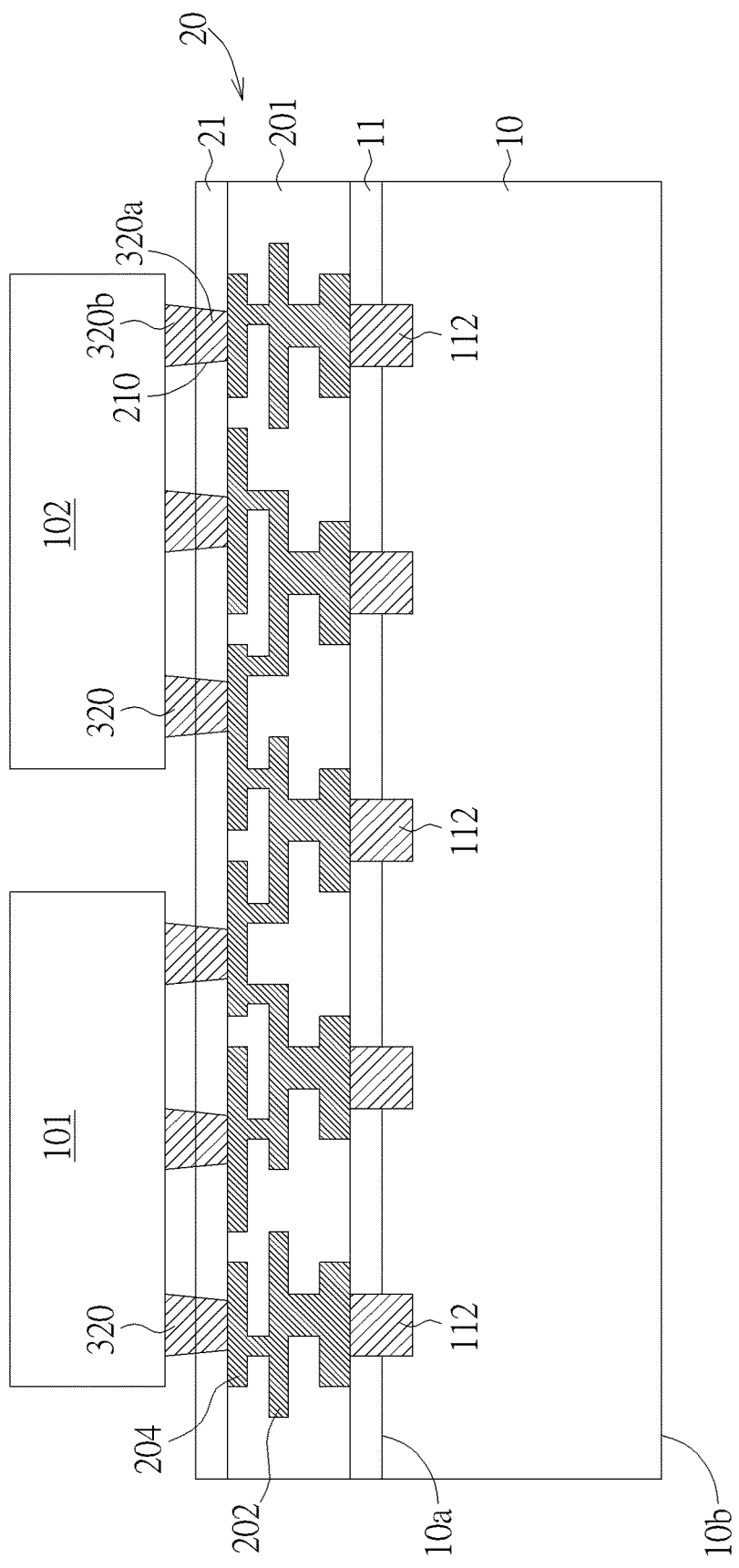

As shown in FIG. 5, a die attachment process is performed. At least a first semiconductor die 101 and at least a second semiconductor die 102 are mounted onto the first metal pillars 320. The first semiconductor die 101 and the second semiconductor die 102 may be flip-chips with their active surfaces facing downward to the first metal pillars 320. The first semiconductor die 101 and the second semiconductor die 102 are electrically connected to the RDL structure 20 through the first metal pillars 320.

Although not shown in FIG. 5, it is understood that micro-bumps may be formed on the respective bonding pads on the first semiconductor die 101 and the second semiconductor die 102. When bonding the first semiconductor die 101 and the second semiconductor die 102, the micro-bumps on the respective bonding pads on the first semiconductor die 101 and the second semiconductor die 102 are aligned with the plurality of first metal pillars 320.

The first semiconductor die 101 and the second semiconductor die 102 are active integrated circuit chips with certain functions, for example, GPU (graphics processing unit), CPU (central processing unit), memory chips, etc. According to the embodiment, the first semiconductor die 101 and the second semiconductor die 102 may be together disposed in one package and may be different chips with their specific functions. Optionally, an underfill (not shown) may be applied under each die.

Figure 6:
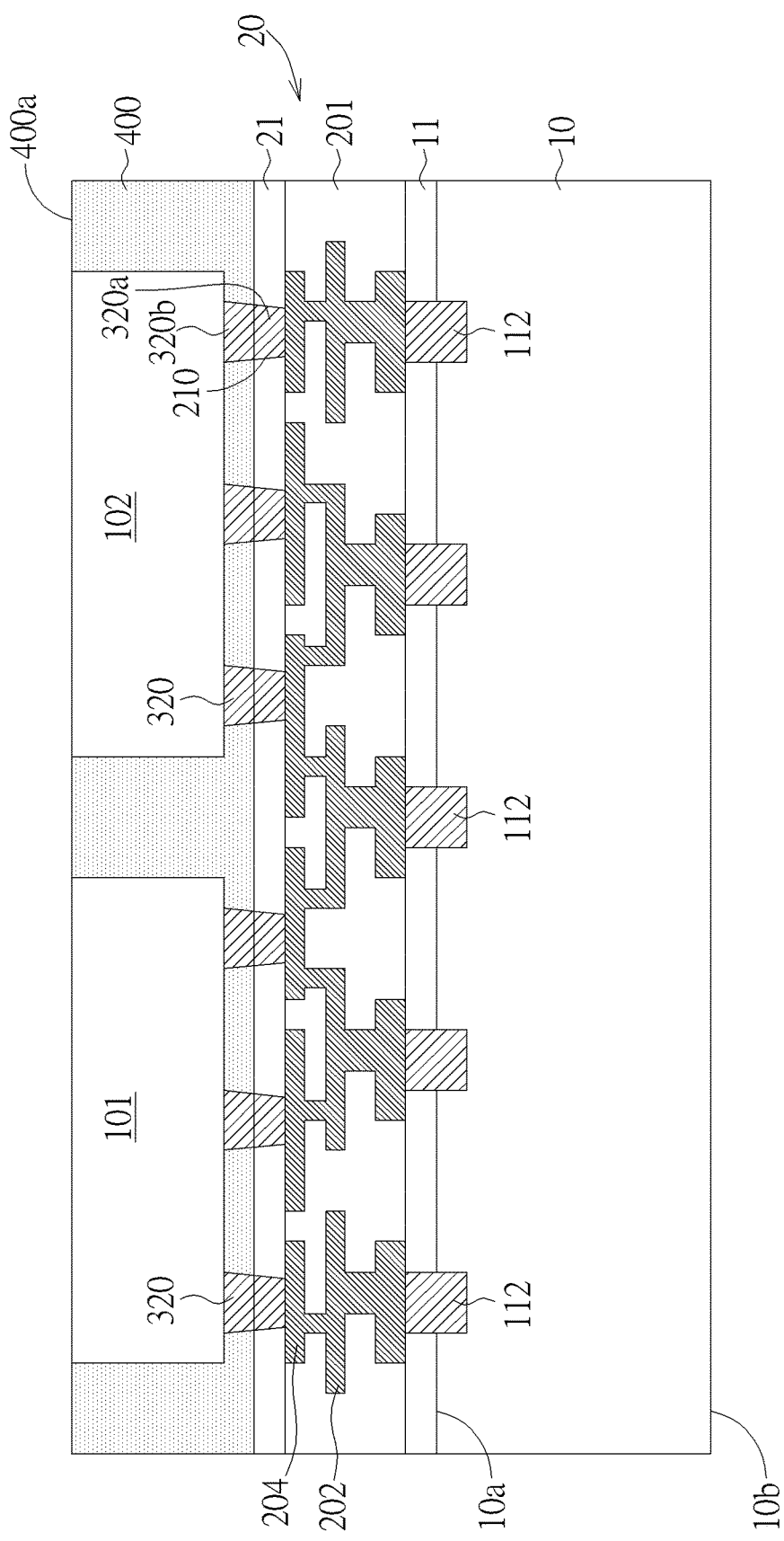

As shown in FIG. 6, a molding compound 400 is applied. The molding compound 400 covers the first semiconductor die 101, the second semiconductor die 102, and the top surface of the second passivation layer 21. Subsequently, the molding compound 400 may be subjected to a curing process. According to the embodiment, the molding compound 400 may comprise a mixture of epoxy and silica fillers, but is not limited thereto.

Optionally, an upper portion of the molding compound 400 may be polished away. The passive surfaces of the first semiconductor die 101 and the second semiconductor die 102 may be exposed and may be coplanar with a surface 400a of the molding compound 400.

Figure 7:
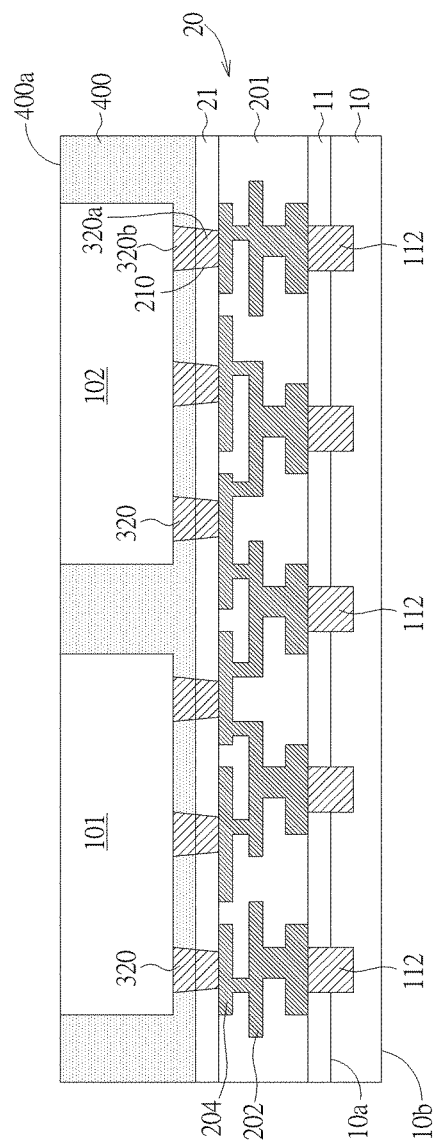

As shown in FIG. 7, after the molding compound 400 is formed, the substrate 10 is subjected to a substrate thinning process. For example, the second surface 10b of the substrate 10 may be subjected to a grinding process to remove a large portion of the substrate 10. After the grinding process is completed, the remaining portion of the substrate 10 still covers the metal via structures 112 and the metal via structures 112 are not exposed at this point.

Figure 8:
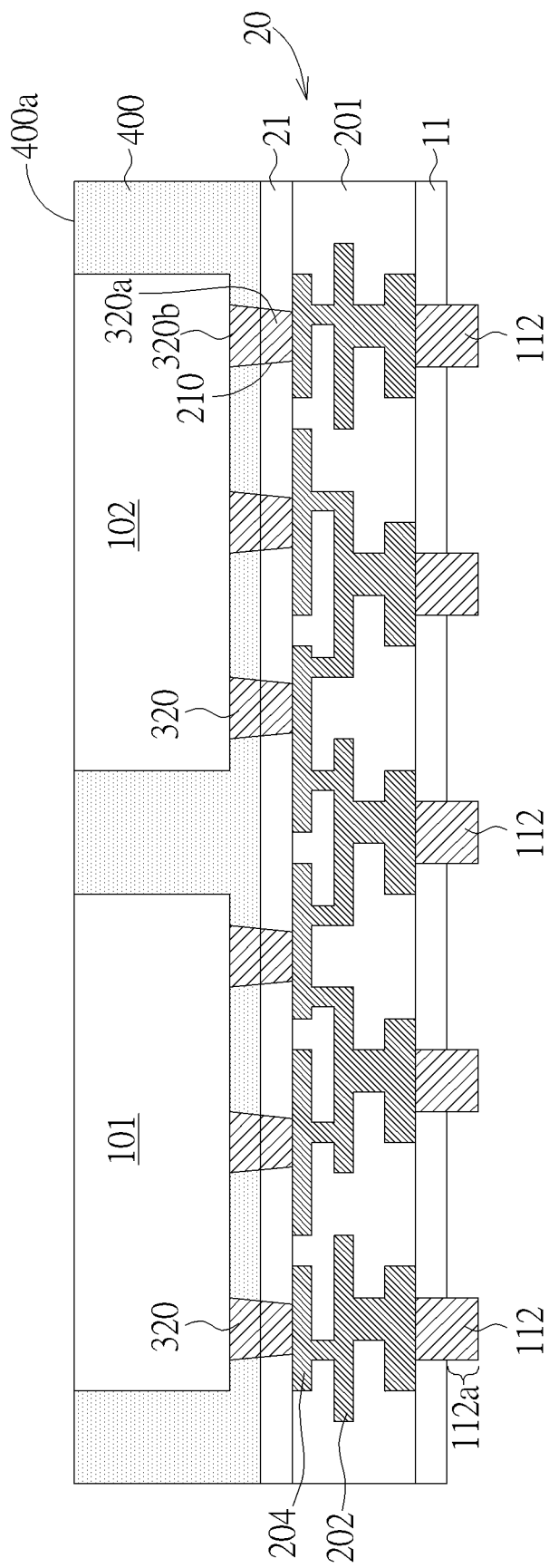

As shown in FIG. 8, after the substrate thinning process, a silicon wet etch back process is performed to remove the remaining portion of the substrate 10, thereby exposing the first passivation layer 11 and the protrudent portions of the metal via structures 112. The protrudent portions of the metal via structures 112 constitute second metal pillars 112a at the bottom side (or PCB side) of the RDL structure 20. The second metal pillars 112a may function as UBM (under bump metallurgy) bumps according to the embodiment.

Alternatively, the metal via structures 112 may be exposed after completing the substrate thinning process. In this case, the aforesaid silicon wet etch back process may be omitted.

Figure 9:
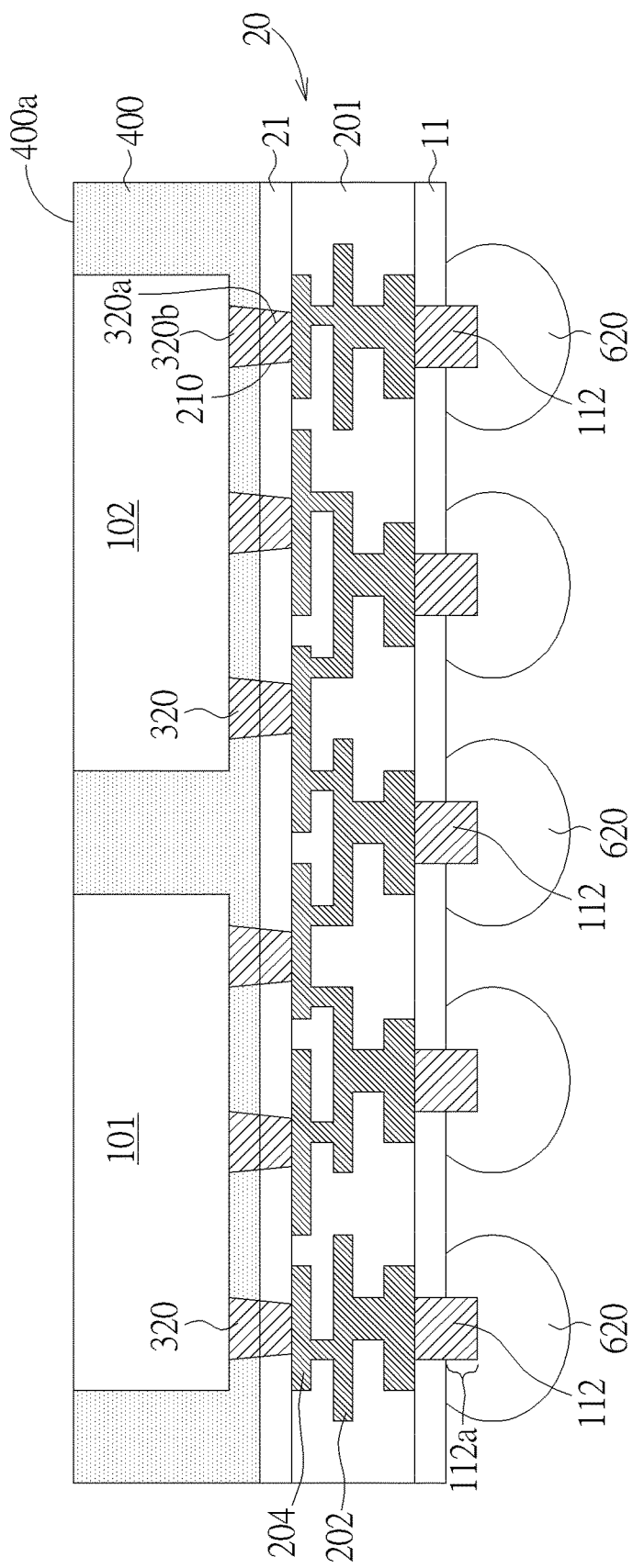

As shown in FIG. 9, a plurality of connecting elements 620 is formed directly on the second metal pillars 112a, respectively. The plurality of connecting elements 620 may comprise solder bumps or C4 bumps. The connecting elements 620 may comprise Au, Ag, Cu, Ni, W, Sn, or combinations thereof. The connecting elements 620 may have a bump pitch that matches the pad pitch of a packaging substrate or a printed circuit board (PCB). Subsequently, a dicing (singulation) process is then performed to separate individual semiconductor packages from one another.

According to the embodiment, the connecting elements 620 may be formed on the second metal pillars 112a by plating or ball dropping, but is not limited thereto. According to another embodiment, the connecting elements 620 may be formed only on the top surface of each of the second metal pillars 112a.

It is advantageous to use the present invention method because the formation of the connecting elements 620 does not involve a photolithographic process, and misalignment of the pad opening due to the warping of the wafer level component can be avoided. The process window and the production yield during the packaging process can be improved.

Further, it is one technical feature of the invention that the second metal pillars 112a for the formation of the solder bumps or C4 bumps on the PCB side and the first metal pillars 320 are completed before the substrate 10 is removed.

FIG. 10 to FIG. 20 are schematic, cross-sectional diagrams illustrating an exemplary method of fabricating a semiconductor package in accordance with another embodiment of the invention, wherein like numeral numbers designate like elements, layers, or regions. FIG. 10 to FIG. 13 illustrate an exemplary method for fabricating a thin RDL interposer structure.

Figure 10:
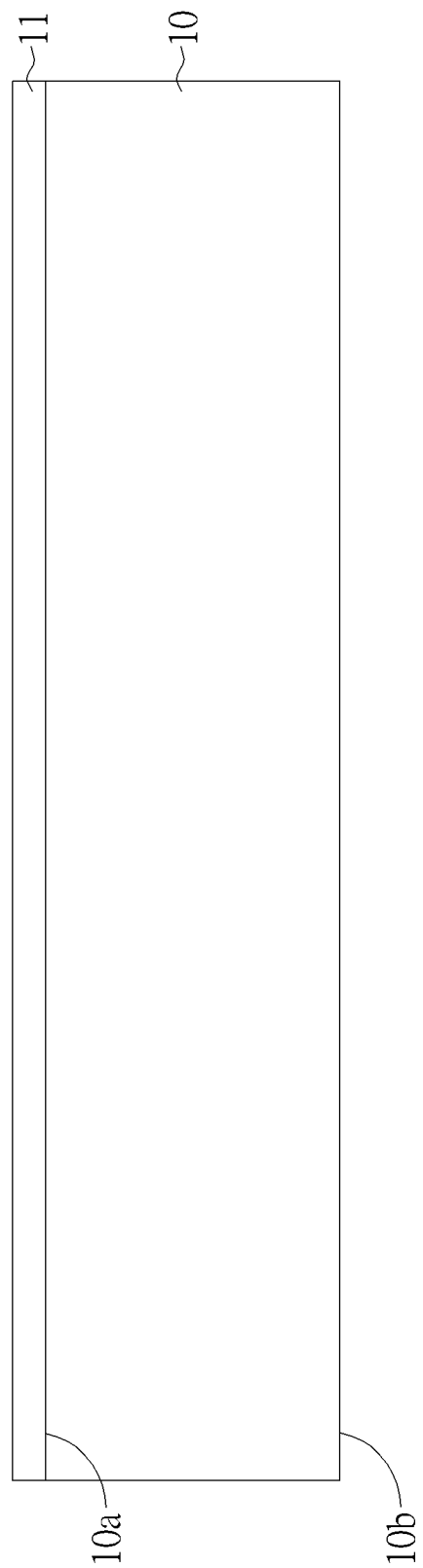
FIG. 10 to FIG. 20 are schematic, cross-sectional diagrams illustrating an exemplary method of fabricating a semiconductor package in accordance with another embodiment of the invention.

As shown in FIG. 10, likewise, a substrate 10 is provided. According to an embodiment of the invention, the substrate 10 may comprise silicon or III-V semiconductors, but is not limited thereto. For example, according to one embodiment, the substrate 10 may be a wafer-shaped silicon substrate. The substrate 10 has an opposite first surface 10a and second surface 10b. A first passivation layer 11 is deposited on the first surface 10a of the substrate 10. The first passivation layer 11 may comprise a dielectric layer. For example, the first passivation layer 11 may comprise silicon nitride, silicon oxide, silicon oxy-nitride, polyimide, or any combinations thereof.

Figure 11:
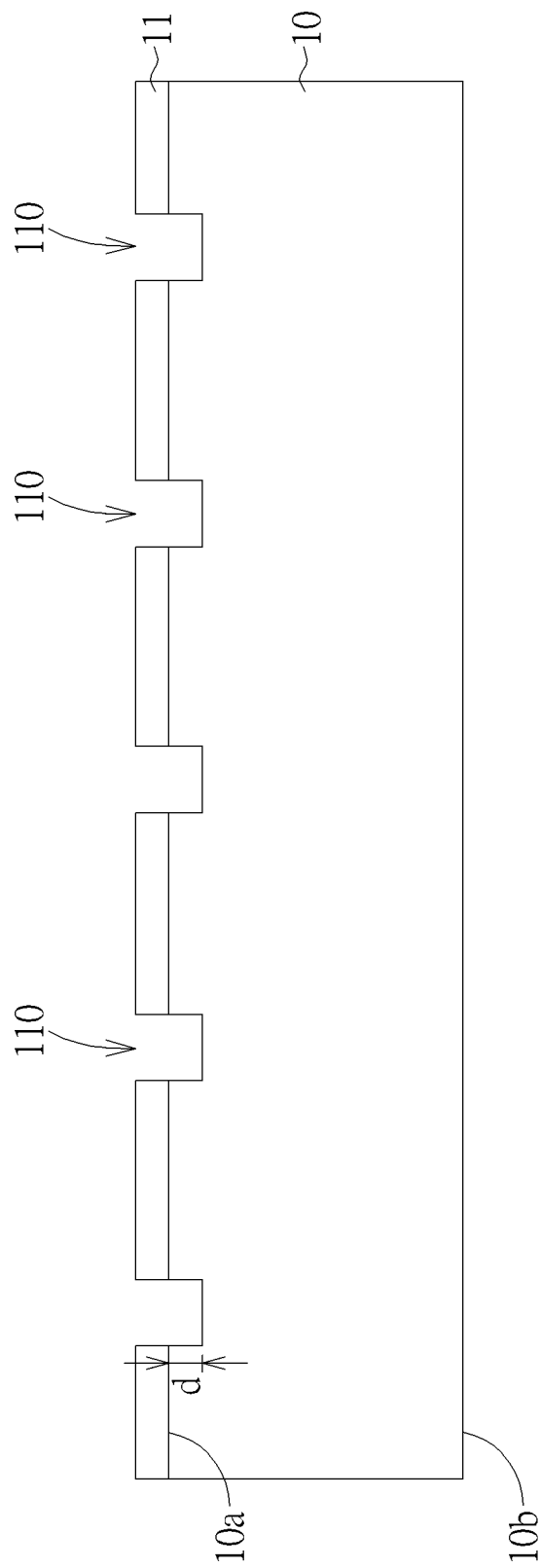

As shown in FIG. 11, a plurality of trenches 110 is formed completely through the first passivation layer 11 and partially through substrate 10 using lithography, mechanical drilling, laser drilling, reactive ion etching (RIE), or a combination thereof. The trenches 110 partially extend from the first surface 10a, but not completely through the substrate 10. For example, each of the trenches 110 may have a depth d that is not greater than 50 micrometers. The trenches 110 may have the same diameter. According to another embodiment, the trenches 110 may have different diameters.

Figure 12:
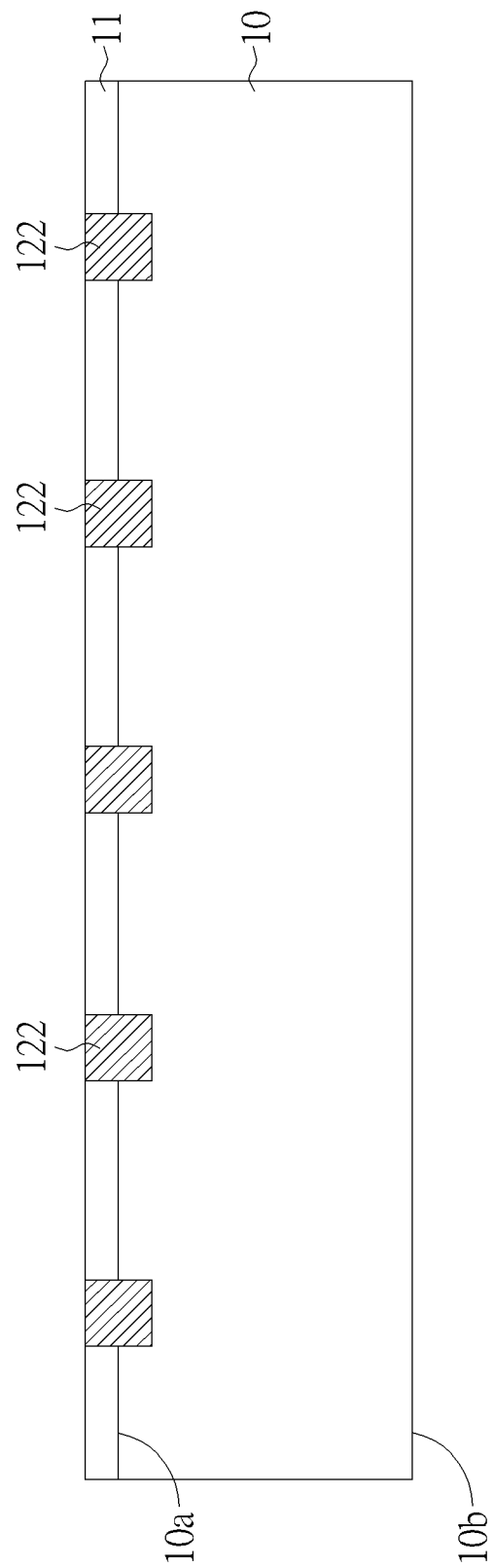

As shown in FIG. 12, subsequently, the trenches 110 are filled with a conductive material including, but not limited to, copper, chrome, nickel, aluminum, gold, silver, tungsten, titanium, or titanium nitride, using electrolytic plating, electroless plating, evaporation, sputtering, printing, or other suitable metal deposition process to form metal via structures 122. According to the embodiment, the conductive material completely fills up the trenches 110.

It is understood that after the deposition of the conductive material, the excess conductive material on the first passivation layer 11 may be removed or planarized by using chemical mechanical polishing (CMP) methods. After CMP, the top surface of the first passivation layer 11 is exposed.

Figure 13:
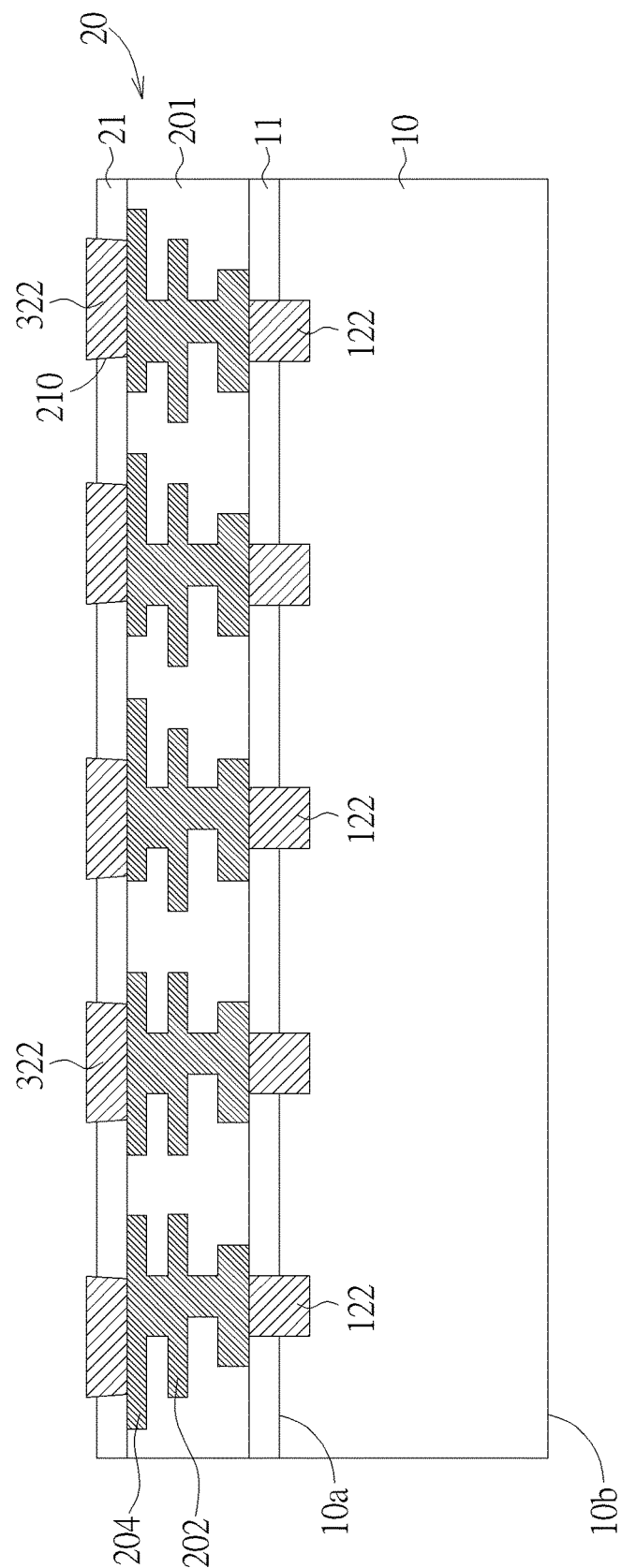

As shown in FIG. 13, a redistribution layer (RDL) structure 20 is fabricated on the first passivation layer 11. According the embodiment of the invention, the RDL structure 20 may comprise at least one dielectric layer 201 and at least one rewiring layer 202. It is understood that the RDL structure 20 may comprise multiple layers of dielectric materials and multiple layers of rewiring layers as depicted in FIG. 13.

According to the embodiment, the dielectric layer 201 may comprise polyimide, BCB, or the like. According to another embodiment, the dielectric layer 201 may comprise silicon oxide, silicon nitride, silicon oxy-nitride, but is not limited thereto. The rewiring layer 202 may comprise copper, aluminum, or a suitable metal alloy, but is not limited thereto. The rewiring layer 202 may have a fine-pitch damascened wiring structure, for example, a copper damascene structure.

According to the embodiment, a plurality of bump pads 204 may be formed in the RDL structure 20 and is electrically connected to the rewiring layer 202. According to the embodiment, the metal via structures 122 are electrically connected to the rewiring layer 202.

According to the embodiment, a second passivation layer 21 may be formed on the RDL structure 20. The bump pads 204 may be exposed, respectively, by pad openings 210 formed in the second passivation layer 21. According to the embodiment, the second passivation layer 21 may comprise a dielectric layer, but is not limited thereto. For example, the second passivation layer 21 may comprise silicon nitride, silicon oxide, silicon oxy-nitride, polyimide, or a combination thereof. According to another embodiment, the second passivation layer 21 may comprise a solder mask, but is not limited thereto.

A plurality of first metal pillars 322 is formed on the respective bump pads 204. For example, the first metal pillars 322 may function as UBM bumps for landing solder bumps or solder balls and may have a bump pitch that matches the pad pitch of a packaging substrate or a printed circuit board (PCB). For example, the first metal pillars 322 may comprise copper, chrome, nickel, aluminum, gold, silver, tungsten, titanium, or titanium nitride, or any suitable metals.

According to the embodiment, the first metal pillars 322 may protrude from the top surface of the second passivation layer 21.

Figure 14:
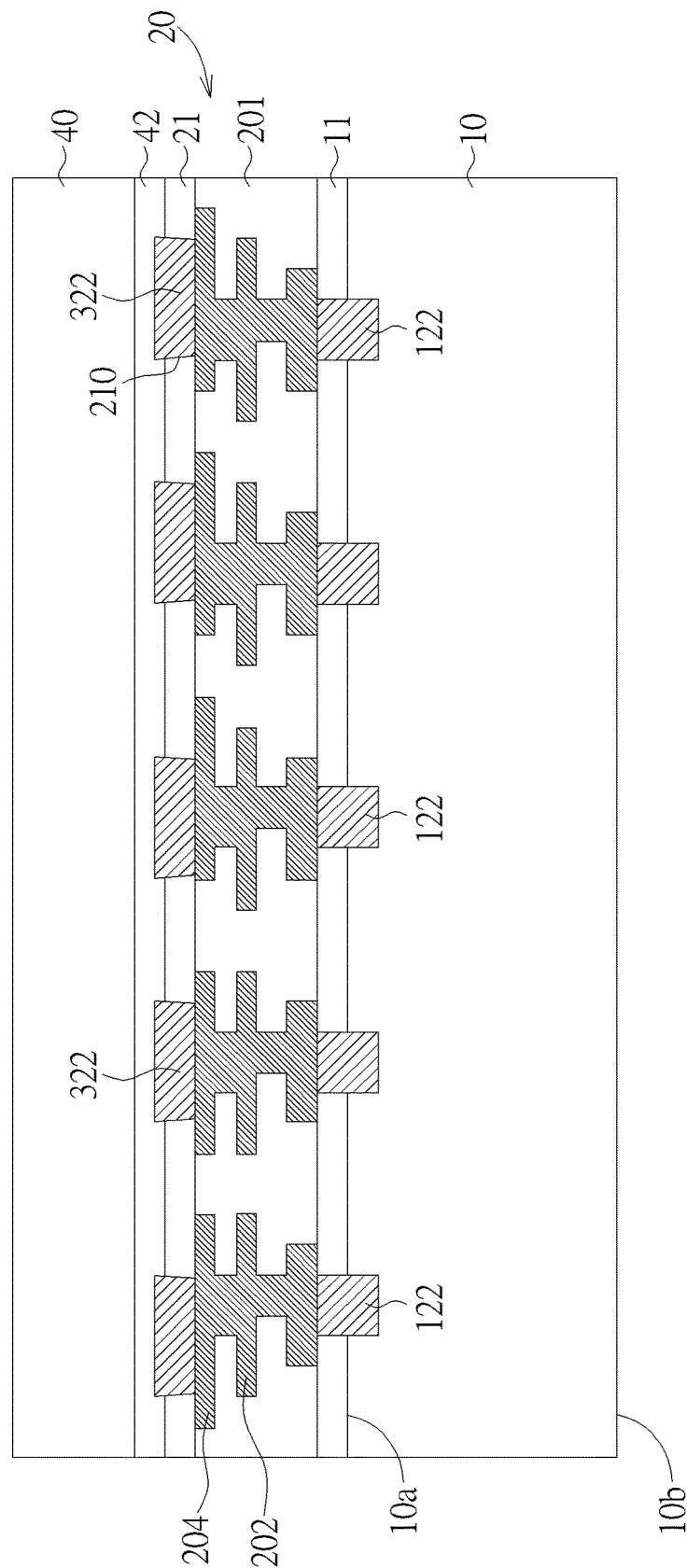

As shown in FIG. 14, a carrier bonding process is performed. A carrier 40 may be attached onto the RDL structure 20 by using an adhesive layer 42. The carrier 40 may be a glass substrate, a metal sheet, or a silicon substrate, but is not limited thereto.

Figure 15:
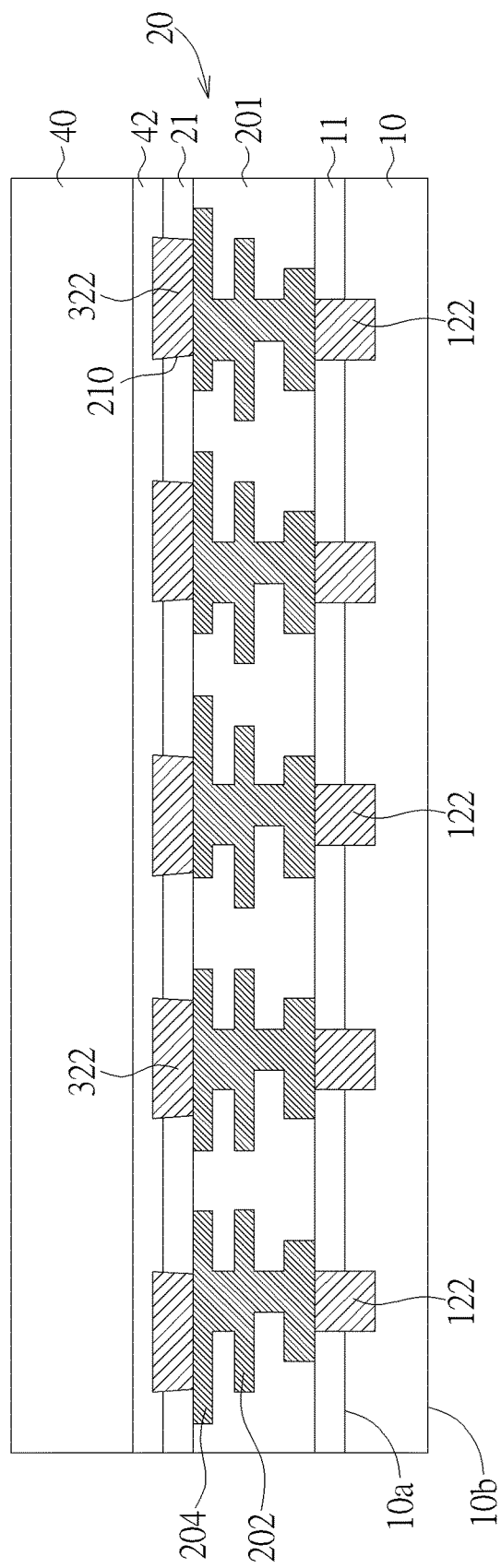

As shown in FIG. 15, after the carrier bonding process, the substrate 10 is subjected to a substrate thinning process. For example, the second surface 10b of the substrate 10 may be subjected to a grinding process to remove a large portion of the substrate 10. After the grinding process is completed, the remaining portion of the substrate 10 still covers the metal via structures 122 and the metal via structures 122 are not exposed at this point.

Figure 16:
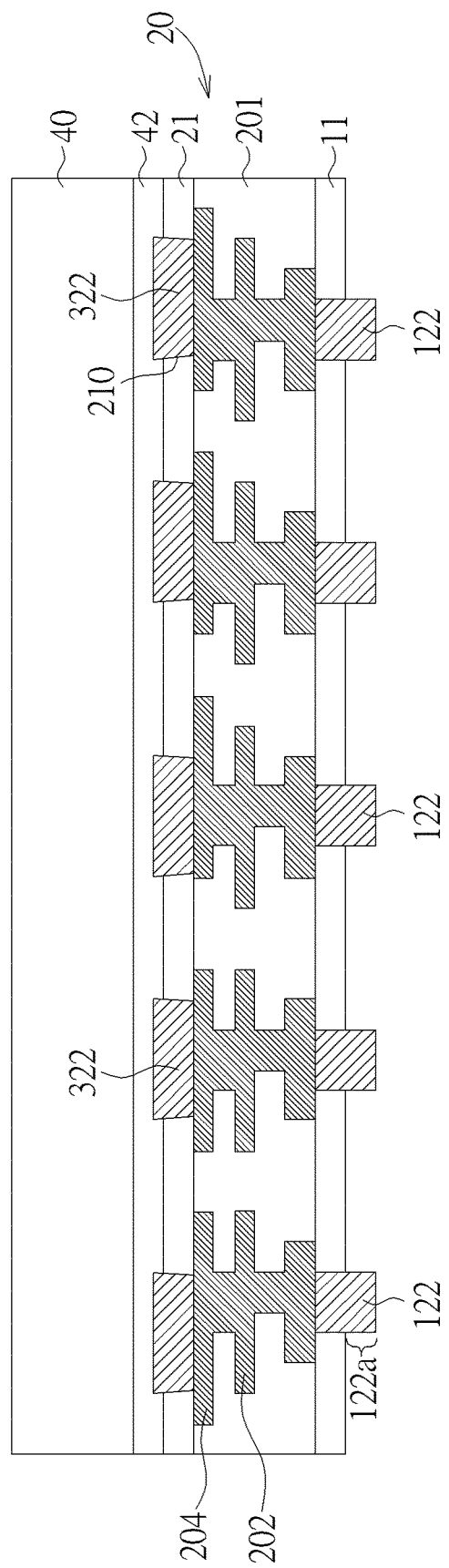

As shown in FIG. 16, after the substrate thinning process, a silicon wet etch back process is performed to completely remove the remaining portion of the substrate 10, thereby exposing the first passivation layer 11 and the protrudent portions of the metal via structures 122. The protrudent portions of the metal via structures 122 constitute second metal pillars 122a at the bottom side (or chip side) of the RDL structure 20. The second metal pillars 122a may function as micro-bumps for the connection to chips or dies according to the embodiment.

Alternatively, the metal via structures 122 may be exposed after completing the substrate thinning process. In this case, the aforesaid silicon wet etch back process may be omitted.

Figure 17:
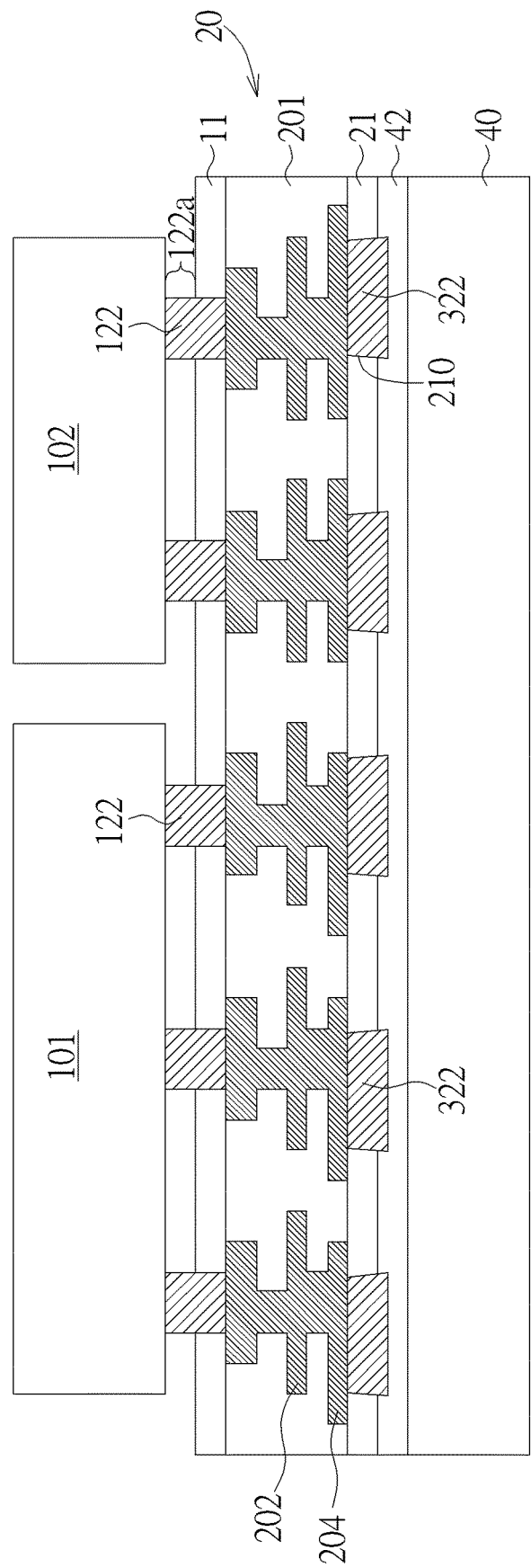

As shown in FIG. 17, subsequently, a die attachment process is performed. At least a first semiconductor die 101 and at least a second semiconductor die 102 are mounted onto the second metal pillars 122a. The first semiconductor die 101 and the second semiconductor die 102 may be flip-chips with their active surfaces facing downward to the second metal pillars 122a. The first semiconductor die 101 and the second semiconductor die 102 are electrically connected to the RDL structure 20 through the second metal pillars 122a.

The first semiconductor die 101 and the second semiconductor die 102 are active integrated circuit chips with certain functions, for example, GPU (graphics processing unit), CPU (central processing unit), memory chips, etc. According to the embodiment, the first semiconductor die 101 and the second semiconductor die 102 may be together disposed in one package and may be different chips with their specific functions. Optionally, an underfill (not shown) may be applied under each die.

Figure 18:
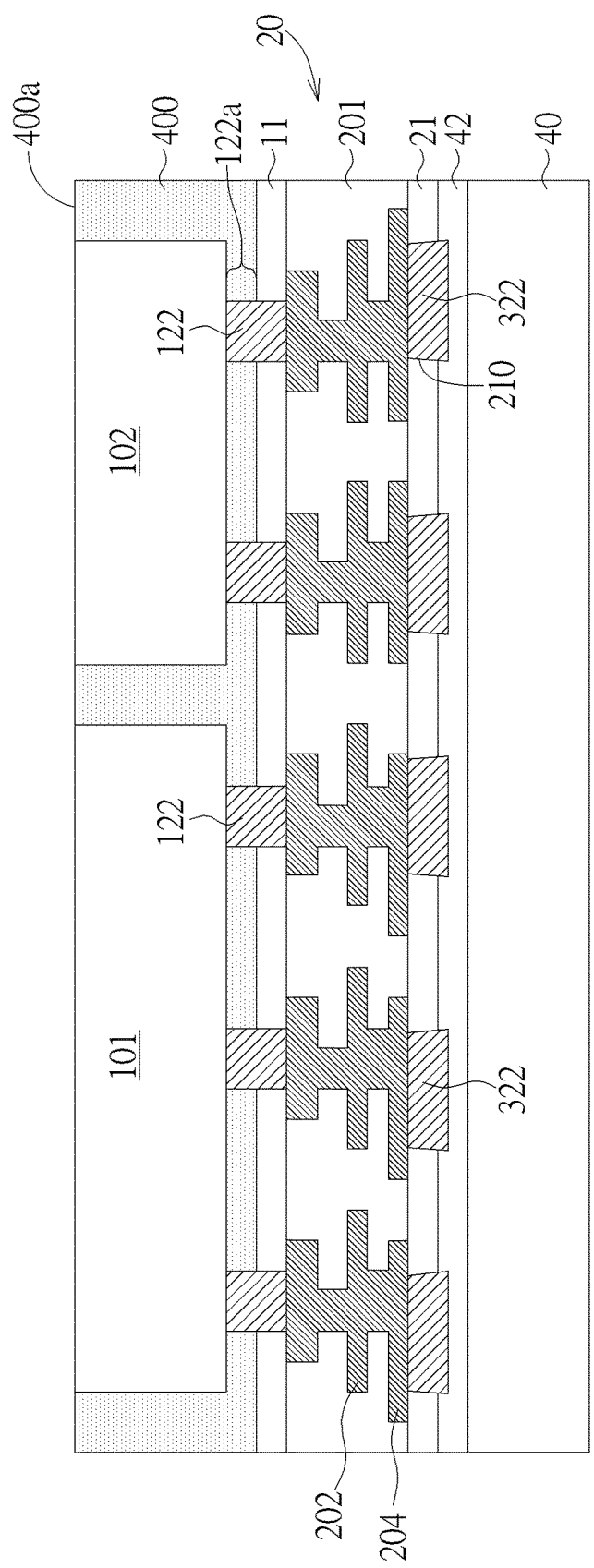

As shown in FIG. 18, a molding compound 400 is applied. The molding compound 400 covers the first semiconductor die 101, the second semiconductor die 102, and the top surface of the first passivation layer 11. Subsequently, the molding compound 400 may be subjected to a curing process. According to the embodiment, the molding compound 400 may comprise a mixture of epoxy and silica fillers, but is not limited thereto.

Optionally, an upper portion of the molding compound 400 may be polished away. The passive surfaces of the first semiconductor die 101 and the second semiconductor die 102 may be exposed and may be coplanar with a surface 400a of the molding compound 400.

Figure 19:
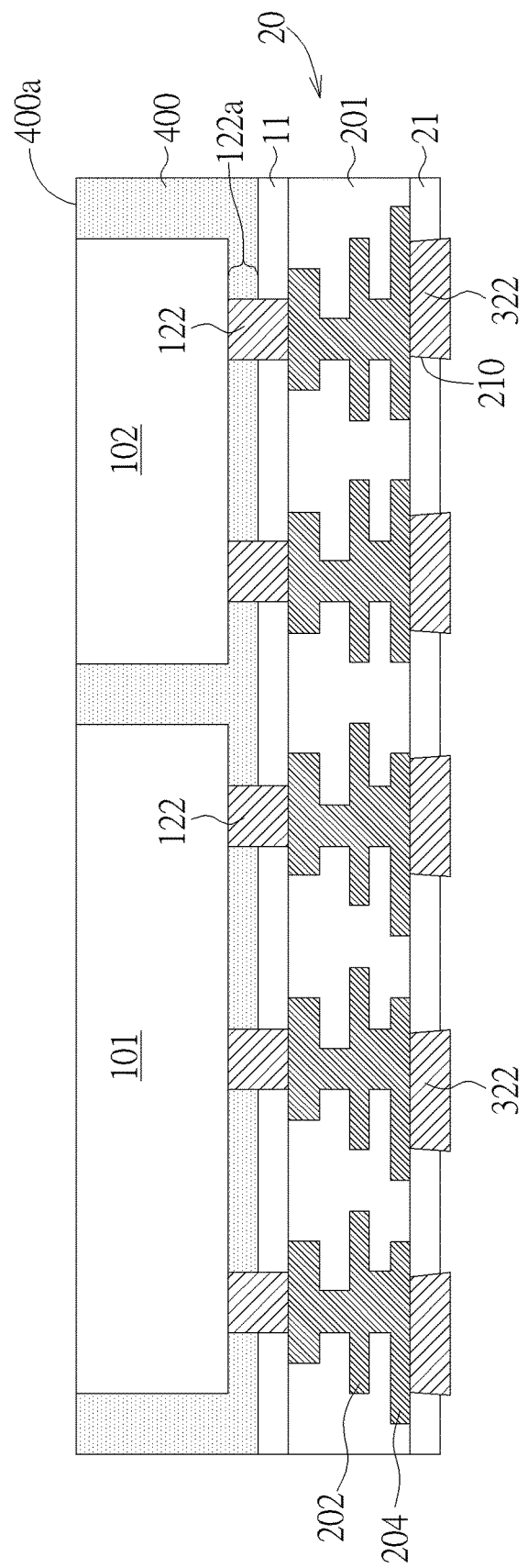

As shown in FIG. 19, after the formation of the molding compound 400, the carrier 40 and the adhesive layer 42 are removed. The first metal pillars 322 and the second passivation layer 21 are revealed.

Figure 20:
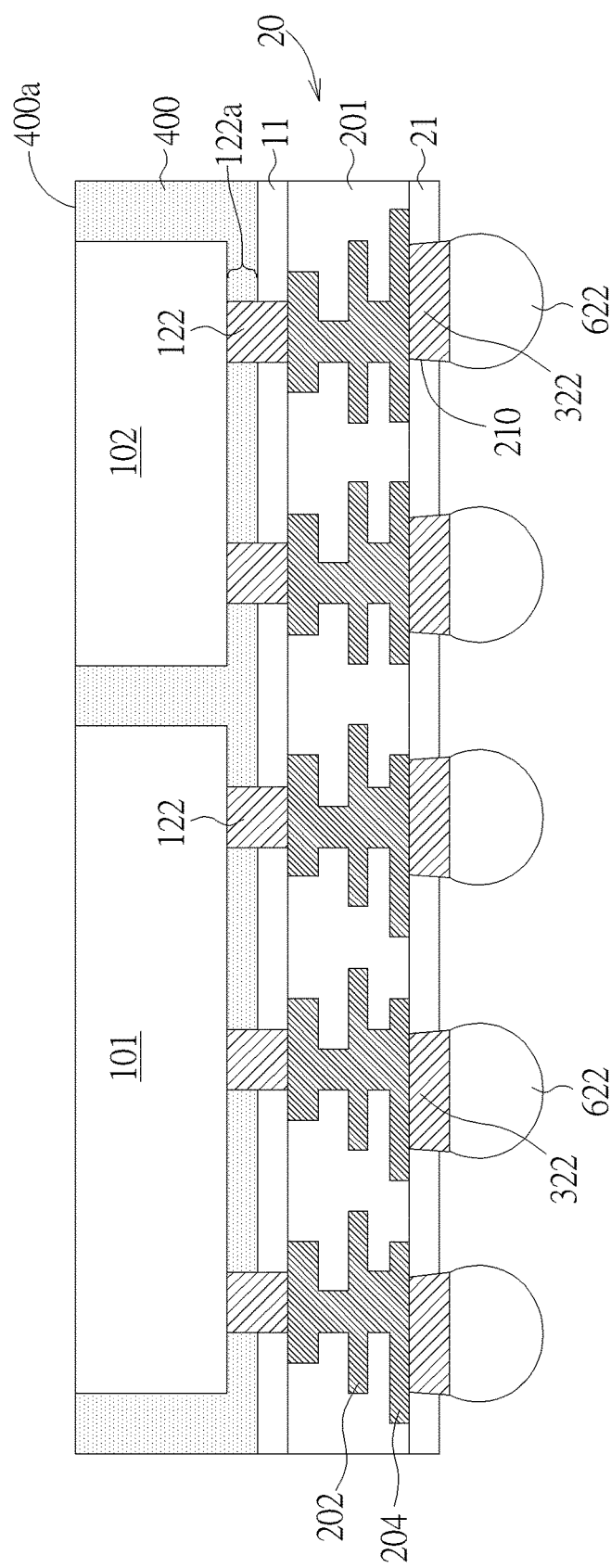

As shown in FIG. 20, a plurality of connecting elements 622 is formed directly on the first metal pillars 322, respectively. The plurality of connecting elements 622 may comprise solder bumps or C4 bumps. The connecting elements 622 may comprise Au, Ag, Cu, Ni, W, Sn, or combinations thereof. Subsequently, a dicing (singulation) process is then performed to separate individual semiconductor packages from one another.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a semiconductor device package, the method comprising:
   providing a substrate having opposite first and second surfaces;
   forming metal via structures extending into the first surface of the substrate, comprising:
   forming a first passivation layer on the first surface of the substrate;
   forming a plurality of trenches penetrating through the first passivation layer and partially through the substrate; and
   filling the plurality of trenches with a conductive material;
   forming a redistribution layer (RDL) structure on the substrate to electrically connect the metal via structures;
   forming first metal pillars on the RDL structure;
   performing a die attachment process to mount semiconductor dies onto the first metal pillars;
   removing the substrate to expose protrudent portions of the metal via structures to form second metal pillars, comprising:
   subjecting the substrate to a substrate thinning process to remove a portion of the substrate; and
   performing a wet etch back process to remove a remaining portion of the substrate to expose the first passivation layer and the protrudent portion of each of the metal via structures; and forming connecting elements on the second metal pillars.

2. The method of claim 1, further comprising forming each of the trenches to a depth that is not greater than 50 micrometers.

3. The method of claim 1, further comprising forming the trenches to substantially the same diameter.

4. The method of claim 1, further comprising forming the trenches to different diameters.

5. The method of claim 1, wherein filling the trenches with a conductive material comprises filing the trenches with copper, chrome, nickel, aluminum, gold, silver, tungsten, titanium, or titanium nitride.

6. The method of claim 1, wherein filling the trenches with a conductive material comprises forming a multiple layer structure in the trenches comprising an adhesive layer, a barrier metals, a seed layer, a wetting layer, or combinations thereof.

7. The method of claim 1, wherein forming first metal pillars on the RDL structure comprises:
   forming a second passivation layer on the RDL structure;
   forming pad openings in the second passivation layer to expose bump pads of the RDL structure; and
   forming the first metal pillars on the bump pads, respectively.

8. The method of claim 7, wherein forming the first passivation layer and the second passivation layer comprise forming from silicon nitride, silicon oxide, silicon oxynitride, polyimide, or a combination thereof.

9. The method of claim 1, wherein providing a substrate comprises providing a silicon substrate.

10. The method of claim 1, further comprising:
    forming a molding compound to cover the semiconductor dies and the first passivation layer; and
    polishing the molding compound to expose passive surfaces of the semiconductor dies and a surface of the molding compound is coplanar with the passive surfaces.

11. The method of claim 1, wherein the first metal pillars are formed as micro-bumps and the second metal pillars are formed as under bump metallurgy (UBM) bumps.

12. The method of claim 11, wherein forming the first metal pillars comprises forming a UBM structure and forming a conductive bump capping the UBM structure.

13. The method of claim 12, wherein forming the conductive bump comprises forming a solder bump or a metal bump.

14. The method of claim 1, wherein forming the connecting elements comprises forming solder bumps or C4 bumps.

15. A method for fabricating a semiconductor package, comprising:
    providing a substrate having opposite first and second surfaces;
    forming metal via structures extending into the first surface of the substrate;
    forming a redistribution layer (RDL) structure on the substrate to electrically connect the metal via structures;
    forming first metal pillars on the RDL structure;
    attaching a carrier to the RDL structure;
    removing the substrate to expose protrudent portions of the metal via structures to form second metal pillars;
    mounting semiconductor dies on the second metal pillars;
    removing the carrier to expose the first metal pillars and the second passivation layer; and
    forming connecting elements directly on the first metal pillars.

16. The method of claim 15, wherein removing the substrate to expose a protrudent portion of each of the metal via structures comprises:
    subjecting the substrate to a substrate thinning process to remove a portion of the substrate; and
    performing a wet etch back process to remove a remaining portion of the substrate, to expose the first passivation layer and the protrudent portions of the metal via structures.

17. The method of claim 16, further comprising:
    forming a molding compound to cover the semiconductor dies and the first passivation layer; and
    polishing the molding compound to expose passive surfaces of the semiconductor dies are exposed and a surface of the molding compound is coplanar with the passive surfaces.

18. The method of claim 15, wherein the first metal pillars are formed as UBM bumps and the second metal pillars are formed as micro-bumps.

* * * * *

UNITED STATES PATENT AND TRADEMARK OFFICE
CERTIFICATE OF CORRECTION

PATENT NO. : 9,922,845 B1  
APPLICATION NO. : 15/342124  
DATED : March 20, 2018  
INVENTOR(S) : Shing-Yih Shih Page 1 of 1

It is certified that error appears in the above-identified patent and that said Letters Patent is hereby corrected as shown below:

On the Title Page  
In ITEM (72) Inventor Column 1: change "Shing-Yih Shih, New Taipei (TW)" to --Shing-Yih Shih, New Taipei City (TW)--

Signed and Sealed this  
First Day of May, 2018

Andrei Iancu  
*Director of the United States Patent and Trademark Office*